United States Patent [19]

Nakajima et al.

[11] Patent Number: 5,262,733
[45] Date of Patent: Nov. 16, 1993

[54] PULSE-WIDTH MODULATION AMPLIFIER

[75] Inventors: Yasufumi Nakajima; Toshihiko Oohashi, both of Osaka, Japan

[73] Assignee: Matsushita Electric Industrial Co., Ltd., Osaka, Japan

[21] Appl. No.: 848,586

[22] Filed: Mar. 9, 1992

[30] Foreign Application Priority Data

Mar. 11, 1991 [JP] Japan ................................ 3-44769

[51] Int. Cl.⁵ .............................................. H03F 3/38
[52] U.S. Cl. ........................................ 330/10; 330/251
[58] Field of Search ...................... 330/10, 251, 207 A

[56] References Cited

U.S. PATENT DOCUMENTS 3,956,716  5/1976  Hamada .
4,737,731  4/1988  Swanson et al. .................. 330/10 X

FOREIGN PATENT DOCUMENTS 0183849   6/1986  European Pat. Off. .
55-103079 8/1980  Japan .
1505829   3/1978  United Kingdom .
2096850  10/1982  United Kingdom .
8504293   9/1985  World Int. Prop. O. ............ 330/10

OTHER PUBLICATIONS

David W. Yeaple, "Hewlett-Packard's New HCTL-1000 Simplifies Closed Loop Motion Control Designs", Wescon 86/Conference Record, Nov. 18–20, 1986, Los Angeles, Calif., U.S.A., pp. 1, 4–8.

Primary Examiner—James B. Mullins
Attorney, Agent, or Firm—Lowe, Price, LeBlanc & Becker

[57] ABSTRACT

A pulse-width modulation amplifier includes a triangular signal oscillator for generating a triangular carrier signal. A voltage comparator compares an input analog signal and the triangular carrier signal, and converts the input analog signal into a corresponding pulse-width modulation signal. A power amplifier serves to amplify the pulse-width modulation signal. A low pass filter removes carrier components from an output signal of the power amplifier, and generates a demodulated signal corresponding to the input analog signal. The amplitude of the triangular carrier signal is controlled in response to a power supply voltage fed to the power amplifier so that the amplitude of the triangular carrier signal will be substantially proportional to the power supply voltage.

17 Claims, 9 Drawing Sheets

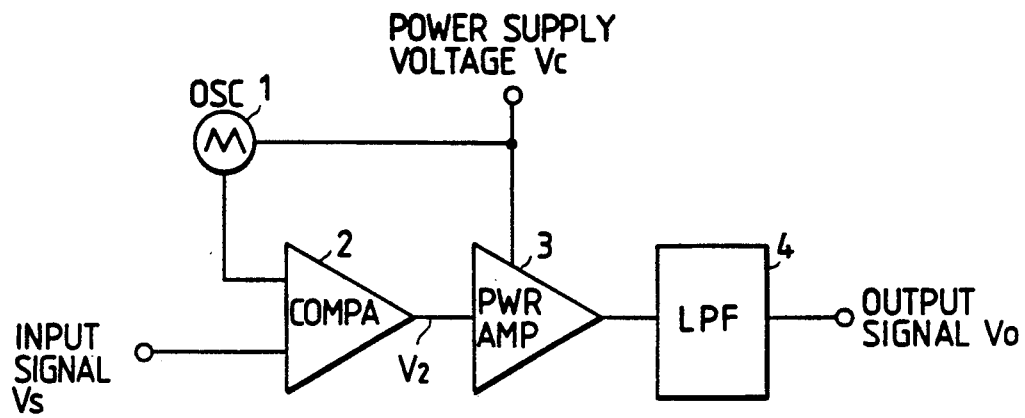
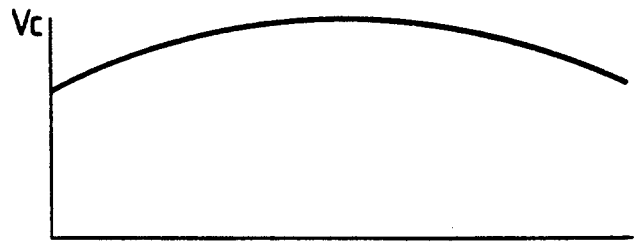
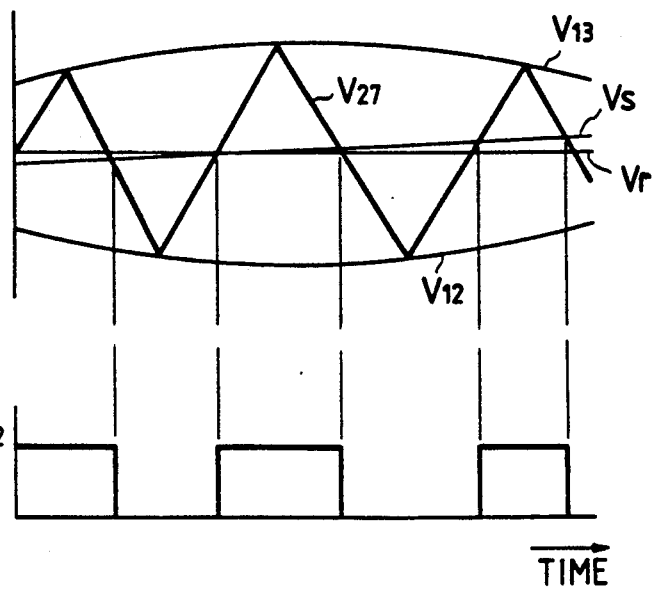

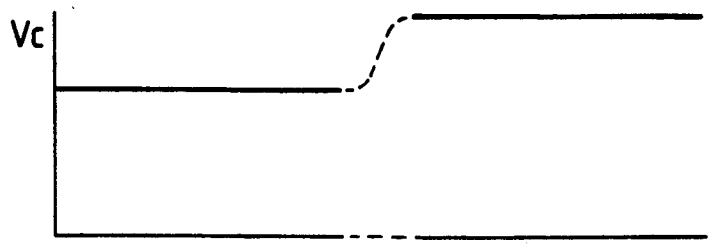
FIG. 5(a)
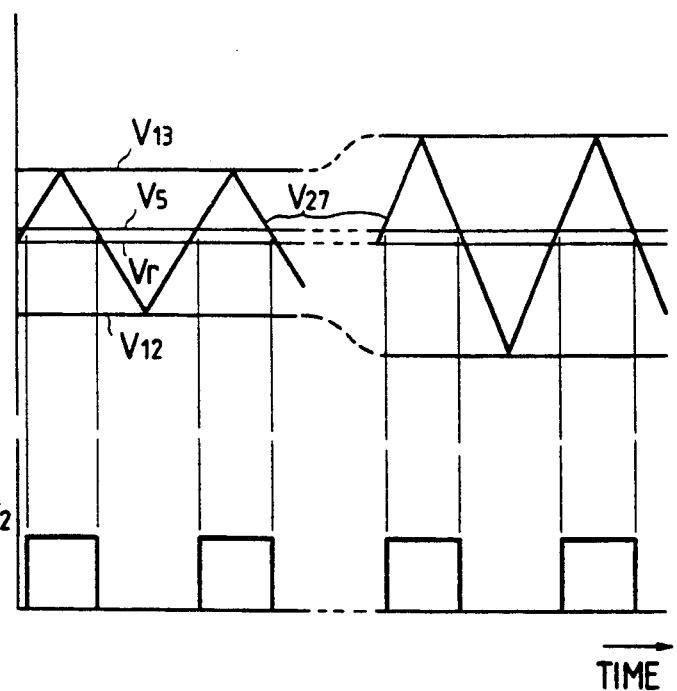
FIG. 5(b)
FIG. 5(c)
FIG. 6
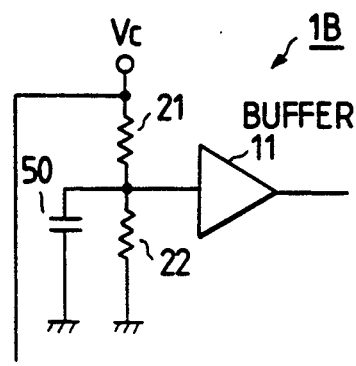

PULSE-WIDTH MODULATION AMPLIFIER

BACKGROUND OF THE INVENTION

1. Field of the Invention

This invention relates to an amplifier using pulse-width modulation.

2. Description of the Prior Art

In general, amplifiers using pulse-width modulation enable efficient power amplification of signals. In such pulse-width modulation amplifiers, a high-frequency triangular signal (a carrier) is modulated with an input analog signal so that the input analog signal is converted into a corresponding pulse-width modulation signal. Then, the pulse-width modulation signal is subjected to power amplification. A low pass filter removes carrier components from the amplified pulse-width modulation signal, demodulating a signal which is equal to a resultant of power amplification of the input analog signal. The demodulated signal is fed to a load. The pulse-width modulation amplifiers are used in various devices such as audio amplifiers or switching power supplies.

Some prior-art pulse-width modulation amplifiers for audio use include a triangular signal oscillator, a voltage comparator, a power amplifier, and a low pass filter. The voltage comparator compares an input audio analog signal with a triangular signal (a carrier) outputted from the triangular signal oscillator, and thereby converts the input audio analog signal into a corresponding pulse-width modulation signal. The power amplifier subjects the pulse-width modulation signal to power amplification, outputting an amplified pulse-width modulation signal. The low pass filter removes carrier components from the amplified pulse-width modulation signal, demodulating a signal which is equal to a resultant of power amplification of the input audio analog signal. The demodulated signal is fed to a load such as a loudspeaker.

Such a prior-art pulse-width modulation amplifier has the following problem. The voltage of the output signal from the prior-art pulse-width modulation amplifier is substantially proportional to a power supply voltage fed to the power amplifier within the pulse-width modulation amplifier. Accordingly, in cases where a power supply voltage fed to the power amplifier has ripple noise of a certain level, the output signal from the prior-art pulse-width modulation amplifier tends to be significantly contaminated by ripple noise.

SUMMARY OF THE INVENTION

It is an object of this invention to provide an improved pulse-width modulation amplifier.

A first aspect of this invention provides a pulse-width modulation amplifier comprising a triangular signal oscillator for generating a triangular carrier signal; a voltage comparator for comparing an input analog signal and the triangular carrier signal and converting the input analog signal into a corresponding pulse-width modulation signal; a power amplifier for amplifying the pulse-width modulation signal; a low pass filter for removing carrier components from an output signal of the power amplifier and generating a demodulated signal corresponding to the input analog signal; and means for controlling an amplitude of the triangular carrier signal in response to a power supply voltage fed to the power amplifier so that the amplitude of the triangular carrier signal will be substantially proportional to the power supply voltage.

A second aspect of this invention provides a pulse-width modulation amplifier comprising means for generating a triangular carrier signal; means for comparing an input analog signal and the triangular signal to convert the input analog signal into a corresponding pulse-width modulation signal; a power amplifier activated by a power supply voltage for amplifying the pulse-width modulation signal; means for converting an output signal from the power amplifier into a demodulated signal corresponding to the input analog signal; and means for controlling the triangular carrier signal in response to the power supply voltage.

A third aspect of this invention provides a pulse-width modulation amplifier comprising means for generating a triangular carrier signal; means for comparing an input analog signal and the triangular signal to convert the input analog signal into a corresponding pulse-width modulation signal; a power amplifier for amplifying the pulse-width modulation signal; means for shortening a width of a first pulse relative to widths of second and later pulses in an output signal from the power amplifier after the power amplifier is activated; means for shortening a width of a final pulse relative to widths of preceding pulses in the output signal of the power amplifier before the power amplifier is deactivated; and means for converting the output signal from the power amplifier into a demodulated signal corresponding to the input analog signal.

BRIEF DESCRIPTION OF THE DRAWINGS

FIG. 1 is a block diagram of a pulse-width modulation amplifier according to a first embodiment of this invention.

FIGS. 3(a)-(c) are a time-domain diagram showing the waveforms of various signals in the pulse-width modulation amplifier of FIG. 1.

FIGS. 5(a)-(c) are a time-domain diagram showing the waveforms of various signals in the pulse-width modulation amplifier according to the second embodiment of this invention.

FIG. 6 is a diagram of a part of a triangular signal oscillator in a pulse-width modulation amplifier according to a third embodiment of this invention.

DESCRIPTION OF THE FIRST PREFERRED EMBODIMENT

With reference to FIG. 1, a pulse-width modulation amplifier includes a triangular signal oscillator 1, a voltage comparator 2, a power amplifier 3, and a low pass filter 4. A power supply voltage Vc is fed to the triangular signal oscillator 1 and the power amplifier 3. The power amplifier 3 is activated by the power supply voltage Vc.

The voltage comparator 2 compares an input analog signal Vs with a triangular signal (a carrier) outputted from the triangular signal oscillator 1, and thereby converts the input analog signal Vs into a corresponding pulse-width modulation signal V2. The power amplifier 3 subjects the pulse-width modulation signal to power amplification, outputting an amplified pulse-width modulation signal. The low pass filter 4 removes carrier components from the amplified pulse-width modulation signal, demodulating a signal Vo which is equal to a resultant of power amplification of the input analog signal Vs. The demodulated signal Vo is fed to a load (not shown).

The triangular signal oscillator 1 is controlled in response to the power supply voltage Vc. Specifically, the amplitude of the triangular signal outputted from the triangular signal oscillator 1 is proportional to the power supply voltage Vc. As will be made clear later, this design enables the demodulated signal Vo to be essentially free from ripple noise even when the power supply voltage Vc fed to the power amplifier 3 has ripple noise of a certain level.

Figure 2:
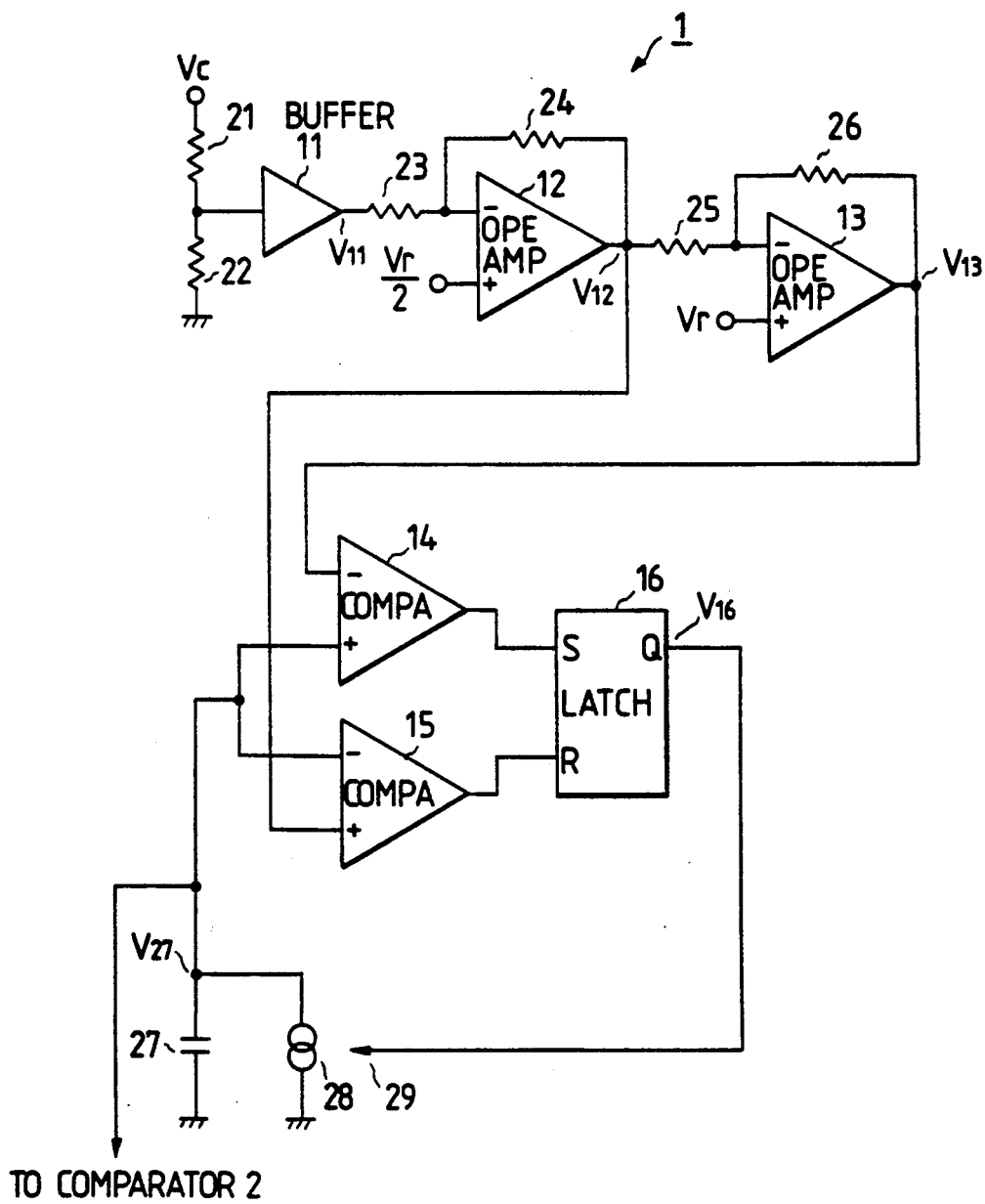
FIG. 2 is a diagram of the triangular signal oscillator of FIG. 1.

As shown in FIG. 2, the triangular signal oscillator 1 includes a buffer 11, operational amplifiers 12 and 13, voltage comparators 14 and 15, a latch 16, resistors 21, 22, 23, 24, 25, and 26, a capacitor 27, and a current source 28.

The resistors 21 and 22 are connected in series, composing a voltage divider which is subjected to the power supply voltage Vc and which divides the power supply voltage Vc at a given ratio. The junction between the resistors 21 and 22 is connected to the input terminal of the buffer 11. The ratio between the resistances of the resistors 21 and 22 is $(1-1/k):1/k$, where "k" denotes a preset value. The buffer 11 outputs a voltage V11 which is expressed as follows.

$$V11 = Vc/k \tag{1}$$

The output terminal of the buffer 11 is connected to the inverting input terminal of the operational amplifier 12 via the resistor 23. The non-inverting input terminal of the operational amplifier 12 is subjected to a half of a stabilized dc voltage Vr providing a bias level for the input analog signal Vs (see FIG. 1). The inverting input terminal and the output terminal of the operational amplifier 12 are connected via the resistor 24. The resistors 23 and 24 have equal resistances. The output terminal of the operational amplifier 12 is connected to the inverting input terminal of the operational amplifier 13 via the resistor 25. The non-inverting input terminal of the operational amplifier 13 is subjected to the stabilized dc voltage Vr. The inverting input terminal and the output terminal of the operational amplifier 13 are connected via the resistor 26. The resistors 25 and 26 have equal resistances. The operational amplifier 12 outputs a voltage V12 which is expressed as follows.

$$V12 = Vr - Vc/k \tag{2}$$

The operational amplifier 13 outputs a voltage V13 which is expressed as follows.

$$V13 = Vr + Vc/k \tag{3}$$

The inverting input terminal of the voltage comparator 14 receives the output voltage V13 from the operational amplifier 13. The non-inverting input terminal of the voltage comparator 15 receives the output voltage V12 from the operational amplifier 12. The non-inverting input terminal of the voltage comparator 14 and the inverting input terminal of the voltage comparator 15 are subjected to a voltage V27 across the capacitor 27. The current source 28 is connected across the capacitor 27. The current source 28 has an additional function of controlling the change between charging the capacitor 27 and discharging the capacitor 27. The output terminal of the voltage comparator 14 is connected to the set terminal of the latch 16. The output terminal of the voltage comparator 15 is connected to the reset terminal of the latch 16. The latch 16 outputs a voltage V16 which is fed to the control terminal of the current source 28 as a charging/discharging control signal 29.

When the voltage V27 across the capacitor 27 rises above the output voltage V13 from the operational amplifier 13, the output signal from the voltage comparator 14 is changed to a high level so that the latch 16 is set. Therefore, the charging/discharging control signal 29 outputted from the latch 16 changes, and thereby the current source 28 enables the capacitor 27 to be discharged at a constant current rate. As the capacitor 27 is discharged, the voltage V27 across the capacitor 27 drops. When the voltage V27 across the capacitor 27 decreases below the output voltage V12 from the operational amplifier 12, the output signal from the voltage comparator 15 is changed to a high level so that the latch 16 is reset. Therefore, the charging/discharging control signal 29 outputted from the latch 16 changes, and thereby the current source 28 enables the capacitor 27 to be charged at a constant current rate. Thus, the voltage V27 across the capacitor 27 varies in a triangular waveform. The voltage V27 across the capacitor 27 is fed to the voltage comparator 2 (see FIG. 1) as a triangular signal.

It is now assumed that the power supply voltage Vc varies as shown in the part (a) of FIG. 3. The output voltage V13 from the operational amplifier 13 varies similarly but the output voltage V12 from the operational amplifier 12 varies oppositely as shown in the part (b) of FIG. 3. The stabilized dc voltage Vr remains constant as shown in the part (b) of FIG. 3. The amplitude of the triangular signal V27 varies in accordance with the output voltages V12 and V13 from the operational amplifiers 12 and 13. Specifically, the voltage of the triangular signal V27 varies within the region between the output voltages V12 and V13 from the operational amplifiers 12 and 13. By referring to the equations (2) and (3), the zero-to-peak amplitude Vt of the triangular signal V27 is expressed as follows.

$$Vt = (V13 - V12)/2 \quad (4)$$
$$= Vc/k$$

As shown in the parts (b) and (c) of FIG. 3, the output signal V2 from the voltage comparator 2 changes between a high level and a low level each time the triangular signal V27 crosses the input analog signal Vs. Thus, the output signal V2 from the voltage comparator 2 is equal to a pulse-width modulation signal corresponding to the input analog signal Vs. As described previously, the pulse-width modulation signal V2 is amplified by the power amplifier 3, and the output signal from the power amplifier 3 is processed and converted into a demodulated signal Vo by the low pass filter 4. The demodulated signal Vo is equal to a resultant of power amplification of the input analog signal Vs. In cases where the power amplifier 3 has a full bridge structure and the low pass filter 4 is composed of an ideal filter, the demodulated signal level Vo is expressed as follows.

$$Vo = Vs(Vc/Vt) \quad (5)$$

By using the relation (4), the equation (5) is transformed into the following equation.

$$Vo = k \cdot Vs \quad (6)$$

The equation (6) shows that the demodulated signal Vo is substantially independent of the power supply voltage Vc. Thus, even when the power supply voltage Vc fed to the power amplifier 3 has ripple noise of a certain level, the demodulated signal Vo is substantially free from ripple noise.

Figure 10:
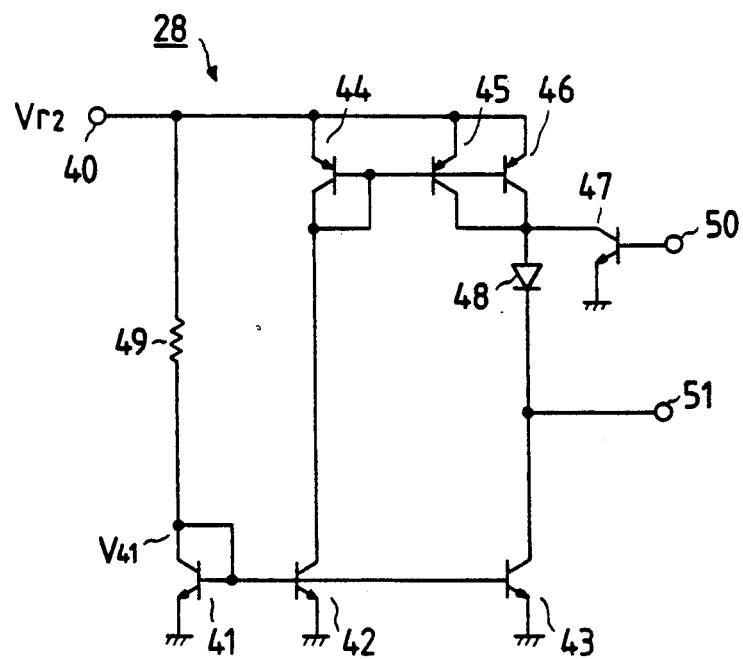
FIG. 10 is a schematic diagram of the current source of FIG. 2.

As shown in FIG. 10, the current source 28 includes NPN transistors 41, 42, 43, and 47, PNP transistors 44, 45, and 46, a diode 48, and a resistor 49. A terminal 40 subjected to a stabilized voltage Vr2 is connected to one end of the resistor 49, and the emitters of the transistors 44, 45, and 46. The other end of the resistor 49 is connected to the collector and the base of the transistor 41, and the bases of the transistors 42 and 43. The emitters of the transistors 41, 42, 43, and 47 are grounded. The collector of the transistor 42 is connected to the collector and the base of the transistor 44, and the bases of the transistors 45 and 46. The anode of the diode 48 is connected to the collectors of the transistors 45, 46, and 47. The cathode of the diode 48 is connected to the collector of the transistor 43, and leads to an output terminal 51. The output terminal 51 is connected to the capacitor 27 of FIG. 2. The base of the transistor 47 leads to a control terminal 50. The control terminal 50 receives the charging/discharging control signal 29 from the latch 16 of FIG. 2.

The transistors 41, 42, and 43 have equal characteristics, and compose a current mirror. The transistors 44, 45, and 46 have equal characteristics, and compose another current mirror. All of the collector currents of the transistors 41, 42, 43, 44, 45, and 46 are approximately equal to a constant current Ic which is expressed as follows:

$$Ic = (Vr2 - V41)/R49 \quad (7)$$

where V41 denotes the collector voltage of the transistor 41 which is essentially constant, and R49 denotes the resistance of the resistor 49.

The current source 28 of FIG. 10 operates as follows. When the charging/discharging control signal 29 fed to the control terminal 50 assumes a high level, the transistor 47 becomes conductive so that the collector currents of the transistors 45 and 46 are drawn via the transistor 47. In this case, a current corresponding to the collector current of the transistor 43 and having a value equal to the above-mentioned constant current value Ic is drawn from the capacitor 27 of FIG. 2 via the output terminal 51. When the charging/discharging control signal 29 fed to the control terminal 50 assumes a low level, the transistor 47 becomes non-conductive so that the sum of the collector currents of the transistors 45 and 46 flows through the diode 48 and is divided into two currents directed toward the capacitor 27 and the collector of the transistor 43 respectively. In this case, a current having a value equal to the above-mentioned constant current value Ic is fed to the capacitor 27 of FIG. 2 via the output terminal 51. In this way, the current source 28 selectively charges and discharges the capacitor 27 of FIG. 2 in response to the charging/discharging control signal 29. The rate of charging and discharging the capacitor 27 of FIG. 2 corresponds to the constant current Ic.

Figure 11:
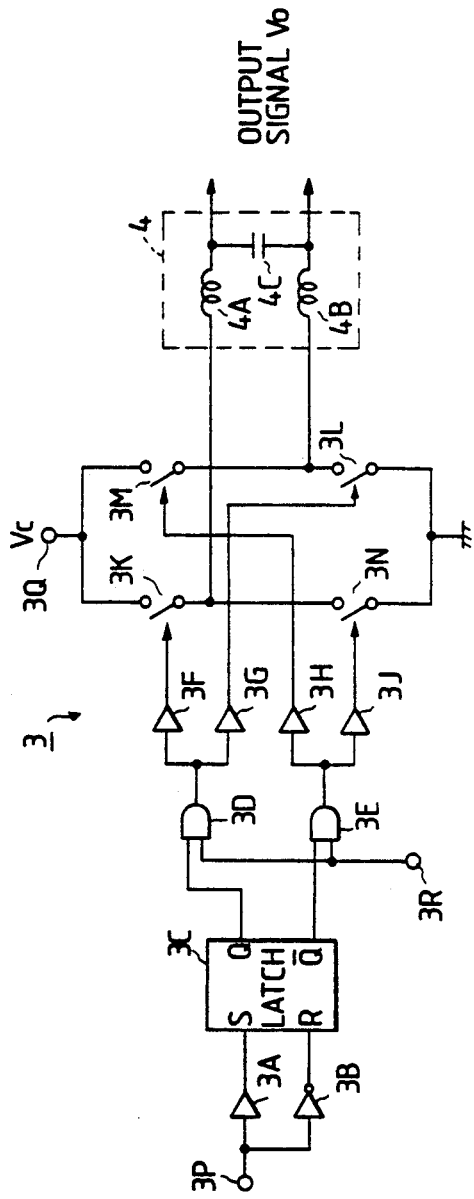
FIG. 11 is a diagram of the power amplifier and the low pass filter of FIG. 1.

The power amplifier 3 is of the full bridge structure. Specifically, as shown in FIG. 11, the power amplifier 3 includes a buffer 3A, an inverter 3B, a latch 3C, AND gates 3D and 3E, switch drivers 3F, 3G, 3H, and 3J, and switches 3K, 3L, 3M, and 3N. The buffer 3A and the inverter 3B receives the output signal from the comparator 2 of FIG. 1 via an input terminal 3P. The buffer 3A and the inverter 3B provide a pair of opposite-phase signals in response to the output signal from the comparator 2 of FIG. 1. The buffer 3A offers a given signal delay corresponding to the signal delay by the inverter 3B, so that the opposite-phase signals provided by the buffer 3A and the inverter 3B can be kept in a correct timing relation. The output signal from the buffer 3A is applied to the set terminal of the latch 3C. The output signal from the inverter 3B is applied to the reset terminal of the latch 3C. The Q output terminal of the latch 3C is connected to a first input terminal of the AND gate 3D. The $\overline{Q}$ output terminal of the latch 3C is connected to a first input terminal of the AND gate 3E. Second input terminals of the AND gates 3D and 3E receive a control signal via a control terminal 3R. When the control signal assumes a high level, the power amplifier 3 is activated. When the control signal assumes a low level, the power amplifier 3 is deactivated. The output terminal of the AND gate 3D is connected to control terminals of the switches 3K and 3L via the drivers 3F and 3G. The output terminal of the AND gate 3E is connected to control terminals of the switches 3M and 3N via the drivers 3H and 3J. The switches 3K, 3L, 3M, and 3N are connected in a full bridge. Specifically, the switches 3K, 3M, 3L, and 3N are connected in a closed loop in that order. The junction between the switches 3K and 3M is connected to a terminal 3Q subjected to the power supply voltage Vc. The junction between the switches 3N and 3L is grounded. The junction between the switches 3K and 3N is connected to a first input terminal of the low pass filter 4. The junction between the switches 3M and 3L is connected to a second input terminal of the low pass filter 4. When the control signal fed to the control terminal 3R is in the high level state, the switches 3K, 3L, 3M, and 3L are closed and opened in response to the output signal from the comparator 2 of FIG. 1 so that the output signal from the comparator 2 of FIG. 1 is subjected to power amplification. In some cases, the delays of operation of the switches 3K and 3N cause the switches 3K and 3N to be simultaneously closed during a certain short period. This phenomenon results in a short circuit regarding the power supply voltage Vc. Also, the switches 3M and 3N can be subjected to a similar phenomenon. The latch 3C is provided to prevent such a short-circuit problem. In addition, to prevent such a short-circuit problem, the control signal fed to the control terminal 3R is designed to periodically set a dead time during which the switches 3K, 3L, 3M, and 3N are forcedly opened.

As shown in FIG. 11, the low pass filter 4 includes an LC network having inductors 4A and 4B, and a capacitor 4C.

Figure 12:
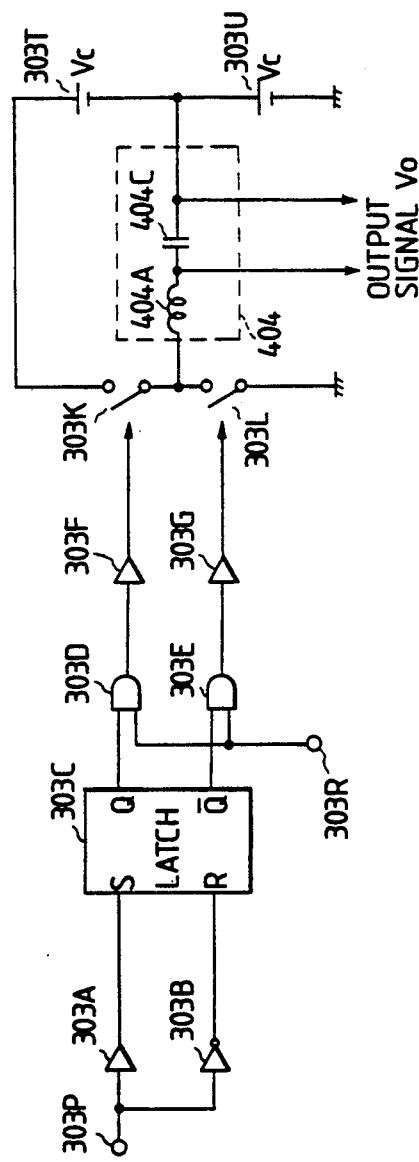
FIG. 12 is a diagram of another example of a power amplifier and a low pass filter.

It should be noted that the power amplifier 3 and the low pass filter 4 may be replaced by a power amplifier 303 and a low pass filter 404 of FIG. 12. The power amplifier 303 of FIG. 12 is of a half bridge structure. As shown in FIG. 12, the power amplifier 303 includes a buffer 303A, an inverter 303B, a latch 303C, AND gates 303D and 303E, switch drivers 303F and 303G, and switches 303K and 303L. The buffer 303A and the inverter 303B receives the output signal from the comparator 2 of FIG. 1 via an input terminal 303P. The output signal from the buffer 303A is applied to the set terminal of the latch 303C. The output signal from the inverter 303B is applied to the reset terminal of the latch 303C. The Q output terminal of the latch 303C is connected to a first input terminal of the AND gate 303D. The $\overline{Q}$ output terminal of the latch 303C is connected to a first input terminal of the AND gate 303E. Second input terminals of the AND gates 303D and 303E receive a control signal via a control terminal 303R. When the control signal assumes a high level, the power amplifier 303 is activated. When the control signal assumes a low level, the power amplifier 303 is deactivated. The output terminal of the AND gate 303D is connected to a control terminal of the switch 303K via the driver 303F. The output terminal of the AND gate 303E is connected to a control terminal of the switch 303L via the driver 303G. The switches 303K and 303L are connected in series. The series combination of the switches 303K and 303L is connected across a series combination of dc constant voltage sources 303T and 303U each generating the power supply voltage Vc. A first end of the low pass filter 404 is connected to the junction between the switches 303K and 303L. A second end of the low pass filter 404 is connected to the junction between the dc constant voltage sources 303T and 303U. The low pass filter 404 includes an LC network having an inductor 404A and a capacitor 404C. When the control signal is in the high level state, the switches 303K and 303L are closed and opened in response to the output signal from the comparator 2 of FIG. 1 so that the output signal from the comparator 2 of FIG. 1 is subjected to power amplification. In some cases, the delays of operation of the switches 303K and 303L cause the switches 303K and 303L to be simultaneously closed during a certain short period. This phenomenon results in a short circuit regarding the power supply voltage Vc. The latch 3C is provided to prevent such a short-circuit problem. In addition, to prevent such a short-circuit problem, the control signal fed to the control terminal 303R is designed to periodically set a dead time during which the switches 303K and 303L are forcedly opened.

DESCRIPTION OF THE SECOND PREFERRED EMBODIMENT

Figure 4:
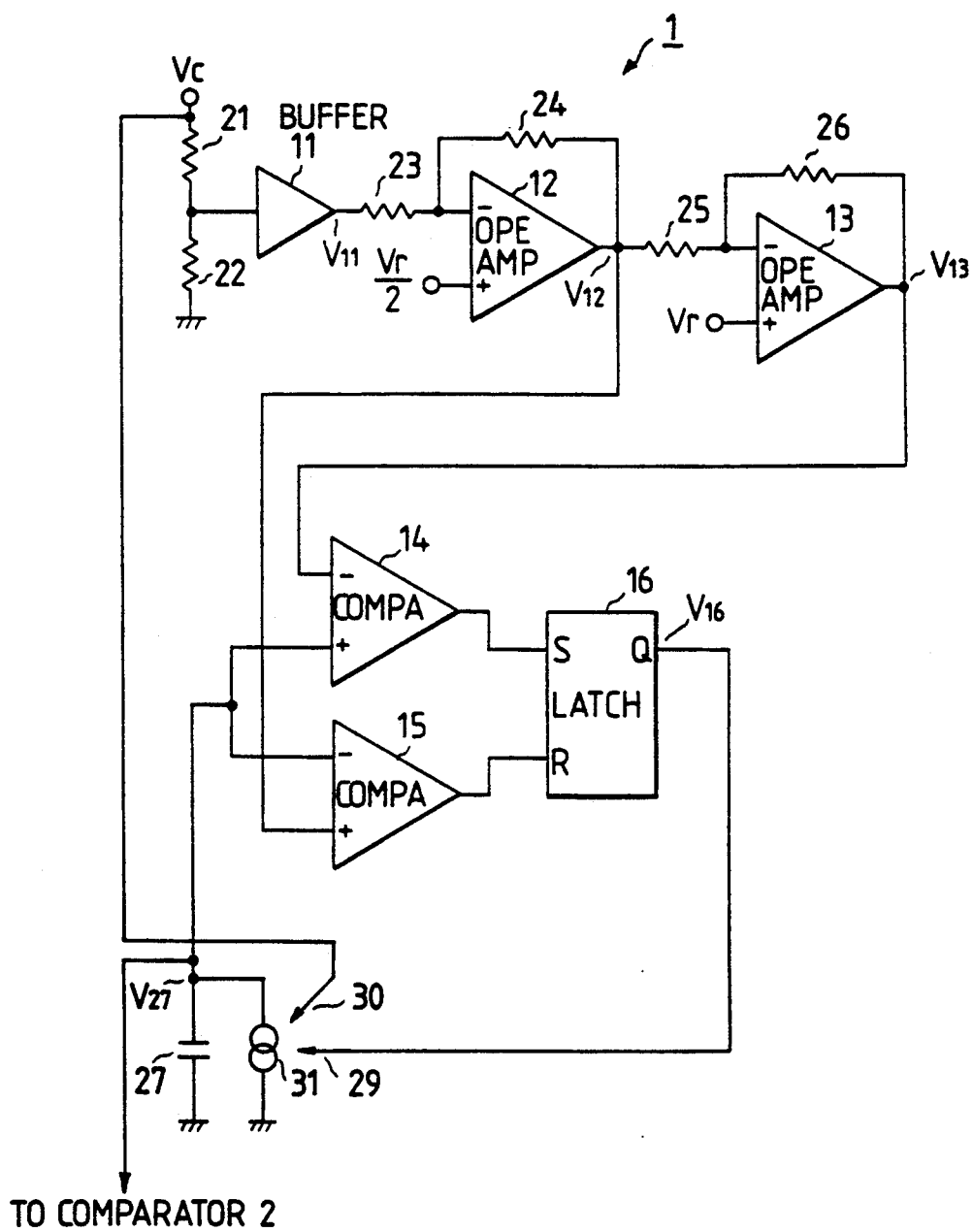
FIG. 4 is a diagram of a triangular signal oscillator in a pulse-width modulation amplifier according to a second embodiment of this invention.

FIG. 4 relates to a second embodiment of this invention which is similar to the embodiment of FIGS. 1-3, and 10-12 except that a triangular signal oscillator 1A is used in place of the triangular signal oscillator 1 of FIG. 2.

As shown in FIG. 4, the triangular signal oscillator 1A includes a current source 31 in place of the current source 28 of FIG. 2. The current source 31 has a first additional function of controlling the change between charging a capacitor 27 and discharging the capacitor 27, and a second additional function of controlling the levels of a charging current and a discharging current related to the capacitor 27. The current source 31 has a charging/discharging control terminal receiving a charging/discharging control signal 29 from a latch 16. The current source 31 also has a current control terminal subjected to a power supply voltage Vc. Thus, the current source 31 is controlled in response to the power supply voltage Vc. Specifically, the levels of the charging current and the discharging current related to the capacitor 27 are substantially proportional to the power supply voltage Vc. In other points, the triangular signal oscillator 1A is similar to the triangular signal oscillator 1 of FIG. 2.

It is now assumed that the power supply voltage Vc increases as shown in the part (a) of FIG. 5. The output voltage V13 from an operational amplifier 13 increases similarly but the output voltage V12 from an operational amplifier 12 decreases oppositely as shown in the part (b) of FIG. 5. A stabilized dc voltage Vr remains constant as shown in the part (b) of FIG. 5. The amplitude of a triangular signal V27 varies in accordance with the output voltages V12 and V13 from the operational amplifiers 12 and 13. Specifically, the voltage of the triangular signal V27 varies within the region between the output voltages V12 and V13 from the operational amplifiers 12 and 13. As shown in the parts (b) and (c) of FIG. 5, the output signal V2 from a voltage comparator 2 changes between a high level and a low level each time the triangular signal V27 crosses an input analog signal Vs. Thus, the output signal V2 from the voltage comparator 2 is equal to a pulse-width modulation signal corresponding to the input analog signal Vs. As described previously, the levels of the charging current and the discharging current related to the capacitor 27 are substantially proportional to the power supply voltage Vc. This design results in the following function. As shown in the parts (a) and (b) of FIG. 5, during a period where the power supply voltage Vc remains in a lower level, the capacitor 27 is charged and discharged at lower rates so that the triangular signal voltage V27 varies at smaller slopes. On the other hand, as shown in the parts (a) and (b) of FIG. 5, during a period where the power supply voltage Vc remains in a higher level, the capacitor 27 is charged and discharged at higher rates so that the triangular signal voltage V27 varies at greater slopes. Thus, the frequency of the triangular signal V27 remains substantially constant although the power supply voltage Vc varies. Also, the frequency of the pulse-width modulation signal V2 remains substantially constant independent of the power supply voltage Vc. The frequency constancy of the triangular signal (the carrier) V27 and the pulse-width modulation signal V2 ensures that the low pass filter 4 reliably removes carrier components.

Figure 13:
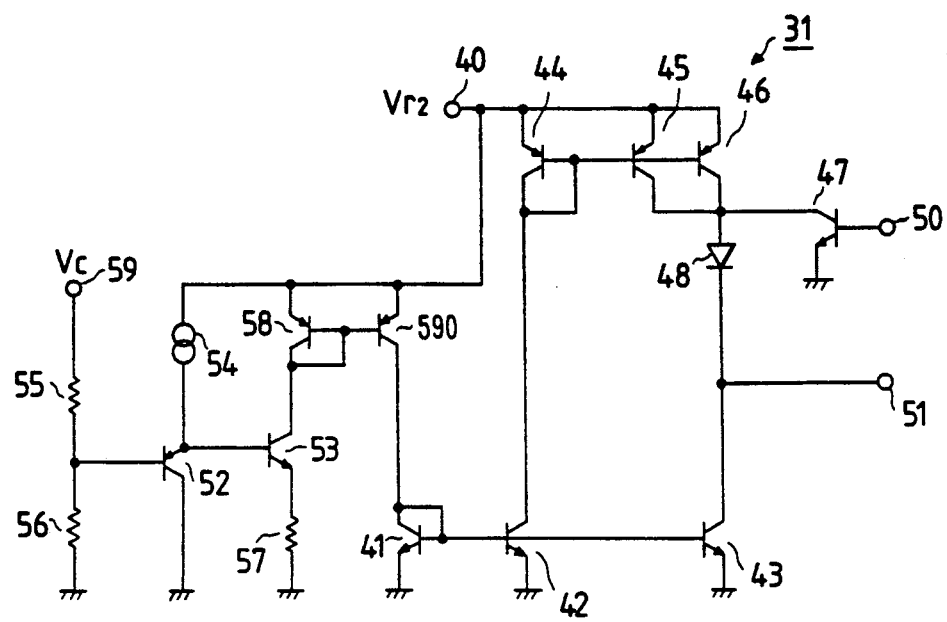
FIG. 13 is a schematic diagram of the current source of FIG. 4.

As shown in FIG. 13, the current source 31 includes NPN transistors 41, 42, 43, 47, and 53, PNP transistors 44, 45, 46, 52, 58, and 590, a diode 48, resistors 55, 56, and 57, and a current source 54. A terminal 40 subjected to a stabilized voltage Vr2 is connected to one end of the current source 54, and the emitters of the transistors 44, 45, 46, 58, and 590. A terminal 59 subjected to the power supply voltage Vc is connected to one end of the resistor 55. The other end of the resistor 55 is connected to one end of the resistor 56 and the base of the transistor 52. The other end of the resistor 56, one end of the resistor 57, the collector of the transistor 52, and the emitters of the transistors 41, 42, 43, and 47 are grounded. The emitter of the transistor 52 is connected to the other end of the current source 54 and the base of the transistor 53. The other end of the resistor 57 is connected to the emitter of the transistor 53. The collector of the transistor 53 is connected to the base and the collector of the transistor 58, and the base of the transistor 590. The collector of the transistor 590 is connected to the collector and the base of the transistor 41, and the bases of the transistors 42 and 43. The collector of the transistor 42 is connected to the collector and the base of the transistor 44, and the bases of the transistors 45 and 46. The anode of the diode 48 is connected to the collectors of the transistors 45, 46, and 47. The cathode of the diode 48 is connected to the collector of the transistor 43, and leads to an output terminal 51. The output terminal 51 is connected to the capacitor 27 of FIG. 4. The base of the transistor 47 leads to a control terminal 50. The control terminal 50 receives the charging/discharging control signal 29 from the latch 16 of FIG. 4.

The transistors 41, 42, and 43 have equal characteristics, and compose a current mirror. The transistors 44, 45, 46, 58, and 590 have equal characteristics, and compose another current mirror. All of the collector currents of the transistors 41, 42, 43, 44, 45, 46, 58, and 590 are approximately equal to a constant current Ic2 which is expressed as follows:

$$Ic2 = V53/R57 \tag{8}$$

where V53 denotes the emitter voltage of the transistor 53, and R57 denotes the resistance of the resistor 57. The voltage at the junction between the resistors 55 and 56 is now denoted by the character V56. Since the transistors 52 and 53 function as a buffer, the voltage V53 is approximately equal to the voltage V56. Thus, the following relation results.

$$V53 = V56 \tag{9}$$

The ratio between the resistances of the resistors 55 and 56 is now denoted as $(1-k2):k2$, and the voltage V56 is expressed as follows:

$$V56 = k2 \cdot Vc \tag{10}$$

By referring to the equations (9) and (10), the equation (8) is transformed into the following equation.

$$Ic2 = k2 \cdot Vc/R57 \tag{11}$$

It is understood from the equation (11) that the value of the current Ic2 is proportional to the power supply voltage Vc.

The current source 31 of FIG. 13 operates as follows. When the charging/discharging control signal 29 fed to the control terminal 50 assumes a high level, the transistor 47 becomes conductive so that the collector currents of the transistors 45 and 46 are drawn via the transistor 47. In this case, a current corresponding to the collector current of the transistor 43 and having a value equal to the above-mentioned current value Ic2 is drawn from the capacitor 27 of FIG. 4 via the output terminal 51. When the charging/discharging control signal 29 fed to the control terminal 50 assumes a low level, the transistor 47 becomes nonconductive so that the sum of the collector currents of the transistors 45 and 46 flows through the diode 48 and is divided into two currents directed toward the capacitor 27 and the collector of the transistor 43 respectively. In this case, a current having a value equal to the above-mentioned current value Ic2 is fed to the capacitor 27 of FIG. 4 via the output terminal 51. In this way, the current source 31 selectively charges and discharges the capacitor 27 of FIG. 4 in response to the charging/discharging control signal 29. The rate of charging and discharging the capacitor 27 of FIG. 4 corresponds to the current value Ic2. Since the current value Ic2 is proportional to the power supply voltage Vc, the rate of charging and discharging the capacitor 27 of FIG. 4 depends on the power supply voltage Vc.

It should be noted that the resistors 21 and 22 of FIG. 4 may also be used as the resistors 55 and 56.

DESCRIPTION OF THE THIRD PREFERRED EMBODIMENT

FIG. 6 relates to a third embodiment of this invention which is similar to the embodiment of FIGS. 4, 5, and 13 except that a triangular signal oscillator 1B is used in place of the triangular signal oscillator 1A of FIG. 4.

As shown in FIG. 6, the triangular signal oscillator 1B includes a capacitor 50 connected in parallel with a resistor 22. In other points, the triangular signal oscillator 1B is similar to the triangular signal oscillator 1A of FIG. 4. In cases where high-frequency noise is superimposed on a power supply voltage Vc, the capacitor 50 serves to prevent the high-frequency noise from causing wrong operation of circuits of later stages.

DESCRIPTION OF THE FOURTH PREFERRED EMBODIMENT

Figure 9:
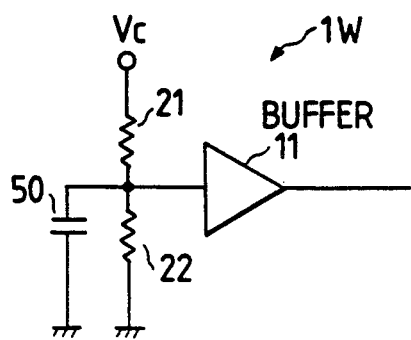
FIG. 9 is a diagram of a part of a triangular signal oscillator in a pulse-width modulation amplifier according to a fourth embodiment of this invention.

FIG. 9 relates to a fourth embodiment of this invention which is similar to the embodiment of FIGS. 1-3, and 10-12 except that a triangular signal oscillator 1W is used in place of the triangular signal oscillator 1 of FIG. 2.

As shown in FIG. 9, the triangular signal oscillator 1W includes a capacitor 50 connected in parallel with a resistor 22. In other points, the triangular signal oscillator 1W is similar to the triangular signal oscillator 1 of FIG. 2. In cases where high-frequency noise is superimposed on a power supply voltage Vc, the capacitor 50 serves to prevent the high-frequency noise from causing wrong operation of circuits of later stages.

DESCRIPTION OF THE FIFTH PREFERRED EMBODIMENT

Figure 7:
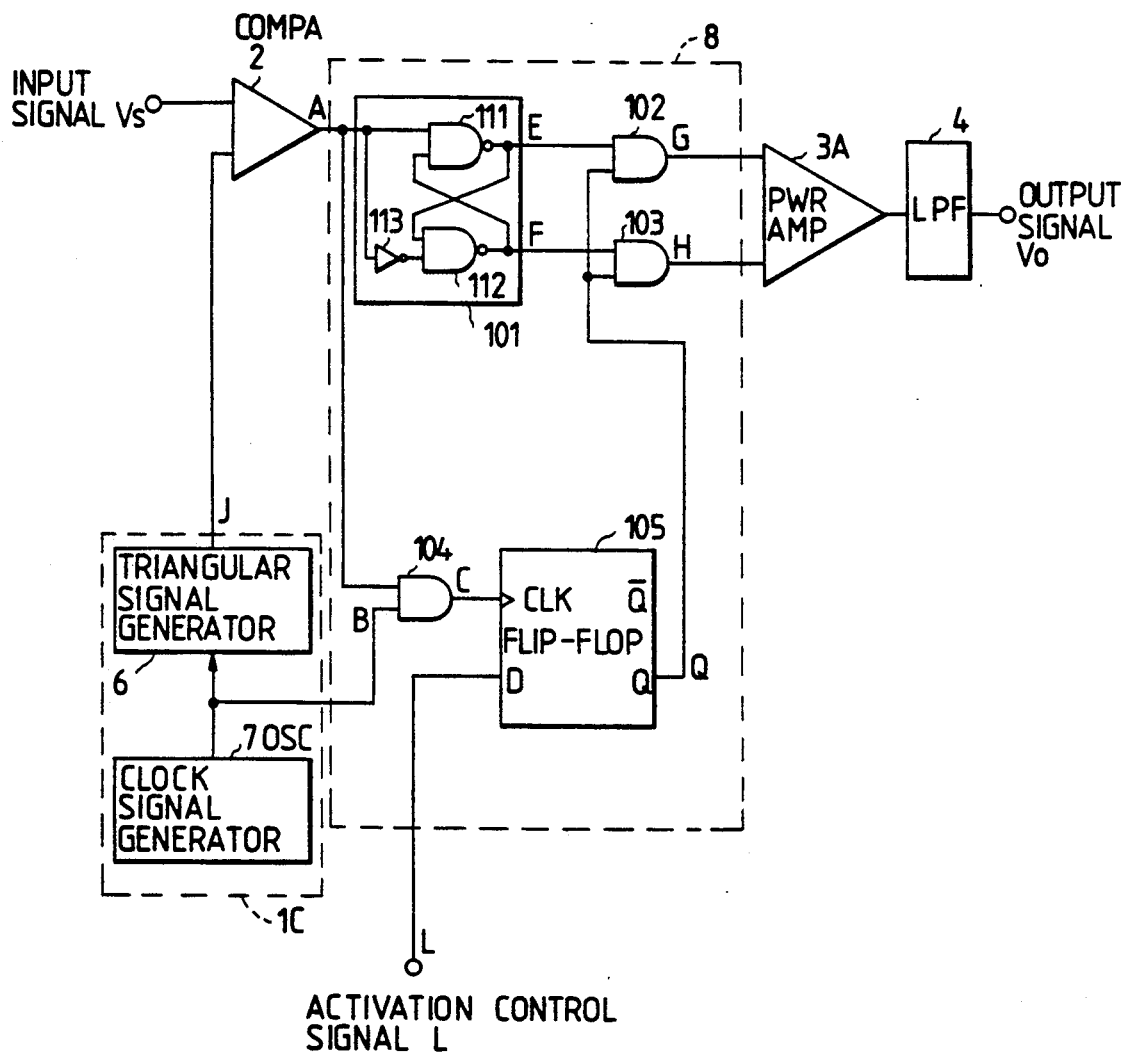
FIG. 7 is a diagram of a pulse-width modulation amplifier according to a fifth embodiment of this invention.

FIG. 7 shows a fifth embodiment of this invention which is similar to the embodiment of FIGS. 1-3, and 10-12 except for design changes indicated hereinafter. The embodiment of FIG. 7 includes a triangular signal oscillator 1C and a power amplifier 3A in place of the triangular signal oscillator 1 and the power amplifier 3 of FIG. 2. The power amplifier 3A has a bridge structure. In addition, the embodiment of FIG. 7 includes a pulse-width modulation signal controller 8 connected among the triangular signal oscillator 1C, a voltage comparator 2, and the power amplifier 3A.

Figure 8:
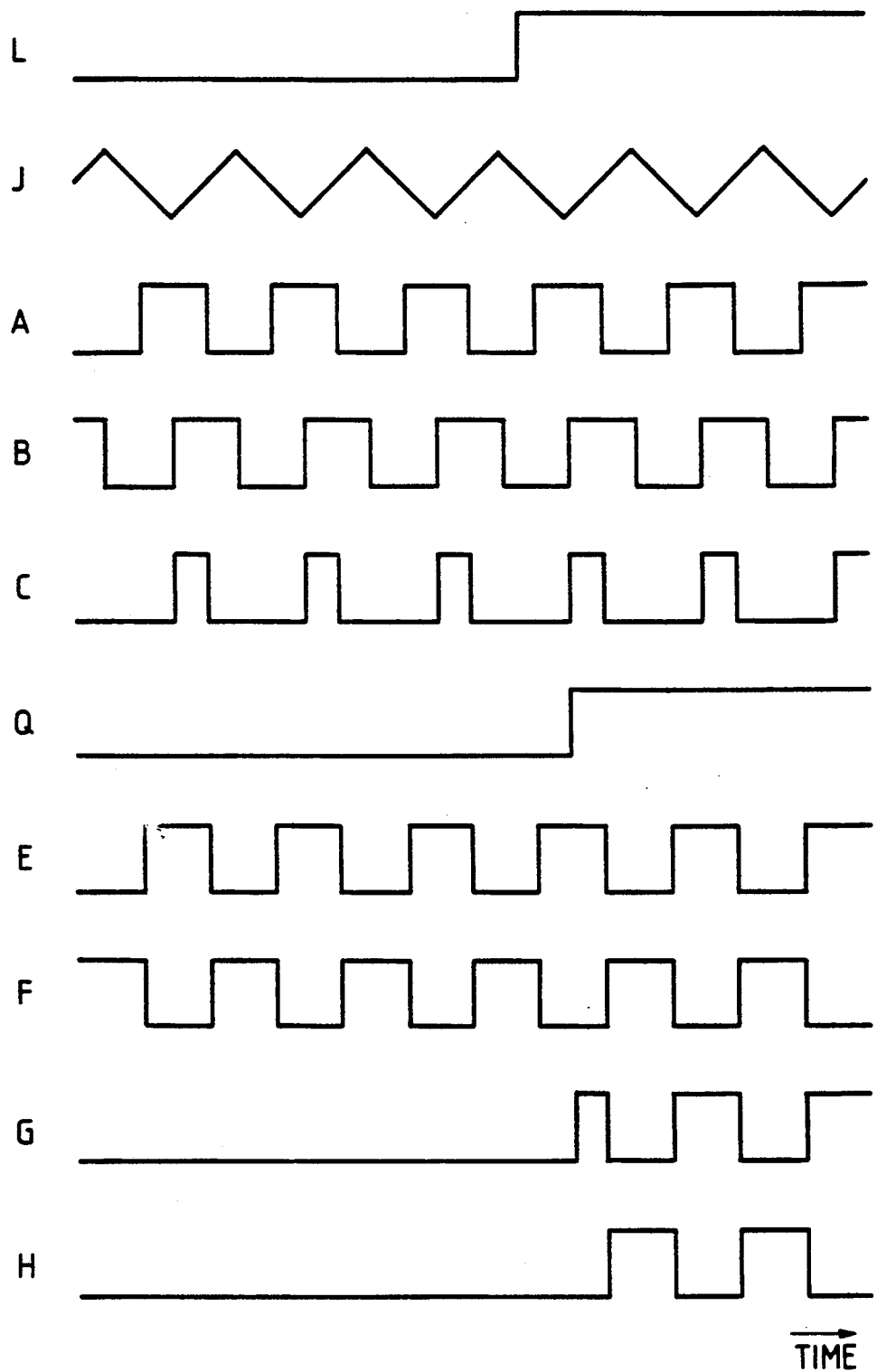
FIG. 8 is a time domain diagram showing the waveforms of various signals in the pulse-width modulation amplifier of FIG. 7.

As shown in FIG. 7, the triangular signal oscillator 1C includes a triangular signal generator 6 and a clock generator 7. The triangular signal generator 6 performs charging and discharging of an internal capacitor, and generates a triangular signal J in response to a clock signal B outputted from the clock generator 7. The triangular signal J and the clock signal B have waveforms such as shown in FIG. 8. The amplitude of the triangular signal J is generally independent of a power supply voltage Vc. It should be noted that the amplitude of the triangular signal J may be controlled in accordance with the power supply voltage Vc as in the embodiment of FIGS. 1-3, and 10-12.

The voltage comparator 2 compares an input analog signal Vs with the triangular signal (a carrier) J outputted from the triangular signal oscillator 1C, and thereby converts the input analog signal Vs into a corresponding pulse-width modulation signal A. The pulse-width modulation signal A has a waveform such as shown in FIG. 8. The pulse-width modulation signal controller 8 generates second and third pulse-width modulation signals G and H on the basis of the pulse-width modulation signal A. The second and third pulse-width modulation signals G and H have opposite phases and waveforms such as shown in FIG. 8. The power amplifier 3A drives internal switching elements (for example, FETs) in response to the second and third pulse-width modulation signals G and H, generating and outputting an amplified pulse-width modulation signal. The low pass filter 4 removes carrier components from the amplified pulse-width modulation signal, demodulating a signal Vo which is equal to a resultant of power amplification of the input analog signal Vs. The demodulated signal Vo is fed to a load (not shown).

As shown in FIG. 7, the pulse-width modulation signal controller 8 includes a latch 101, AND gates 102, 103, and 104, and a D flip-flop 105. The pulse-width modulation signal A, the triangular signal J, and the clock signal B have a phase relation such as shown in FIG. 8. Specifically, the pulse-width modulation signal A and the clock signal B are 90-degree out of phase. The AND gate 104 executes AND operation between the pulse-width modulation signal A and the clock signal B, generating a signal C which has a waveform such as shown in FIG. 8. The signal C is equal to a signal which results from removing the former half of each positive pulse of the pulse-width modulation signal A and thereby shortening each positive pulse of the pulse-width modulation signal A into the latter half thereof. The signal C is applied to the clock input terminal of the D flip-flop 105. An activation control signal L is applied to the D input terminal of the D flip-flop 105. The activation control signal L has a waveform such as shown in FIG. 8. The D flip-flop 105 outputs a signal Q in response to the signals C and L. The signal Q has a waveform such as shown in FIG. 8. The signal Q is applied to first input terminals of the AND gates 102 and 103.

The latch 101 includes NAND gates 111 and 112 and an inverter 113. The pulse-width modulation signal A outputted from the voltage comparator 2 is fed to the input terminal of the inverter 113 and a first input terminal of the NAND gate 111. The output terminal of the inverter 113 is connected to a first input terminal of the NAND gate 112. A second input terminal of the NAND gate 111 is connected to the output terminal of the NAND gate 112. A second input terminal of the NAND gate 112 is connected to the output terminal of the NAND gate 111. The latch 101 generates signals E and F on the basis of the pulse-width modulation signal A. As shown in FIG. 8, the signals E and F have opposite phases, and the signal E is equal in phase and waveform to the pulse-width modulation signal A. The signal F agrees with the inversion of the signal E. The signal E is applied to a second input terminal of the AND gate 102. The signal F is applied to a second input terminal of the AND gate 103.

The AND gate 102 executes AND operation between the signals E and Q, outputting the second pulse-width modulation signal G. The AND gate 103 executes AND operation between the signals F and Q, outputting the third pulse-width modulation signal H. As shown in FIG. 8, when the activation control signal L assumes a high level, the second and third pulse-width modulation signals G and H are moved into operative states and thus the pulse-width modulation amplifier is enabled. When the activation control signal L assumes a low level, the signals G and H are moved into inoperative states and thus the pulse-width modulation amplifier is suspended. As shown in FIG. 8, at a start of the period where the activation control signal L remains at the high level, that is, at a start of the operation of the pulse-width modulation amplifier, a first positive pulse of the third pulse-width modulation signal G is halved in width. Similarly, at an end of the period where the activation control signal L remains at the high level, that is, at an end of the operation of the pulse-width modulation amplifier, a final positive pulse of the third pulse-width modulation signal G is halved in width. Thus, at a start and an end of the operation of the pulse-width modulation amplifier, the duty cycle of the amplified pulse-width modulation signal outputted from the power amplifier 3A is decreased to about ½. In cases where an audio signal is handled by the pulse-width modulation amplifier, the decrease in the duty cycle of the amplified pulse-width modulation signal suppresses or prevents pop noise in a demodulated signal which might occur at a start and an end of the operation of the pulse-width modulation amplifier.

The power amplifier 3A is similar to the portion of the power amplifier 3 of FIG. 11 which follows the AND gates 3D and 3E. The power amplifier 3A may also be similar to the portion of the power amplifier 303 of FIG. 12 which follows the AND gates 303D and 303E.

The triangular signal oscillator 1C may be replaced by the triangular signal oscillator 1 of FIG. 2. In this case, the charging/discharging control signal 29 outputted from the latch 16 (see FIG. 2) is fed to the AND gate 104.

The triangular signal oscillator 1C may be replaced by the triangular signal oscillator 1A of FIG. 4. In this case, the charging/discharging control signal 29 outputted from the latch 16 (see FIG. 4) is fed to the AND gate 104.

DESCRIPTION OF THE SIXTH PREFERRED EMBODIMENT

Figure 14:
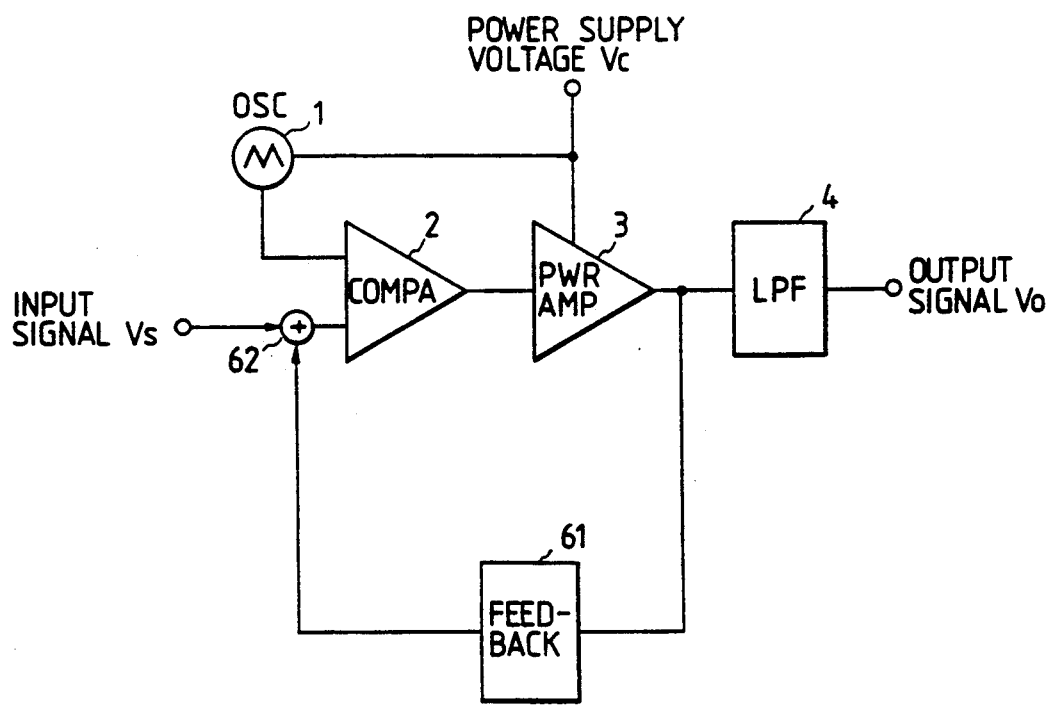
FIG. 14 is a block diagram of a pulse-width modulation amplifier according to a sixth embodiment of this invention.

FIG. 14 shows a sixth embodiment of this invention which is similar to the embodiment of FIGS. 1-3, and 10-12 except for the following additional design. The embodiment of FIG. 14 includes a negative-feedback circuit 61 and an adder 62. An input analog signal Vs is fed to a first input terminal of the adder 62. The negative-feedback circuit 61 includes, for example, a low pass filter. The negative-feedback circuit 61 generates a feedback signal on the basis of the output signal of power amplifier 3. The negative-feedback circuit 61 outputs the feedback signal to a second input terminal of the adder 62. The adder 62 adds the input analog signal Vs and the feedback signal, outputting a voltage signal which corresponds to the sum of the voltages of the input analog signal Vs and the feedback signal. The output signal of the adder 62 is fed to the comparator 2.

The embodiment of FIG. 14 subjects the processed signal to the negative feedback which enables a decreased distortion of a demodulated output signal Vo.

What is claimed is:

1. A pulse-width modulation amplifier comprising:
   a triangular signal oscillator for generating a triangular carrier signal;
   a voltage comparator for comparing an input analog signal and the triangular carrier signal and converting the input analog signal into a corresponding pulse-width modulation signal;
   a power amplifier for amplifying the pulse-width modulation signal;
   a low pass filter for removing carrier components from an output signal of the power amplifier and generating a demodulated signal corresponding to the input analog signal;
   means for controlling an amplitude of the triangular carrier signal in response to a power supply voltage fed to the power amplifier so that the amplitude of the triangular carrier signal will be substantially proportional to the power supply voltage,
   further comprising means connected between the voltage comparator and the power amplifier for reducing a duty cycle of the pulse-width modulation signal at a start and an end of the pulse-width modulation amplifier.

2. The pulse-width modulation amplifier of claim 1, further comprising means for controlling a rate of a voltage variation in the triangular carrier signal in response to the power supply voltage so that the rate of the voltage variation in the triangular carrier signal will be substantially proportional to the power supply voltage.

3. The pulse-width modulation amplifier of claim 2, wherein the triangular signal oscillator comprises means for generating a clock signal, and means for generating the triangular carrier signal in response to the clock signal, and wherein the duty cycle reducing means comprises means for reducing the duty cycle in response to the clock signal.

4. The pulse-width modulation amplifier of claim 1, wherein the triangular signal oscillator comprises means for generating a clock signal, and means for generating the triangular carrier signal in response to the clock signal, and wherein the duty-cycle reducing means comprises means for reducing the duty cycle in response to the clock signal.

5. A pulse-width modulation amplifier comprising:
   means for generating a triangular carrier signal;
   means for comparing an input analog signal and the triangular signal to convert the input analog signal into a corresponding pulse-width modulation signal;
   a power amplifier for amplifying the pulse-width modulation signal;
   means for shortening a width of a first pulse relative to widths of second and later pulses in an output signal from the power amplifier after the power amplifier is activated;
   means for shortening a width of a final pulse relative to widths of preceding pulses in the output signal of the power amplifier before the power amplifier is deactivated; and
   means for converting the output signal from the power amplifier into a demodulated signal corresponding to the input analog signal.

6. A pulse-width modulation amplifier comprising:
   a triangular signal oscillator for generating a triangular carrier signal;
   a voltage comparator for comparing an input analog signal and the triangular carrier signal and converting the input analog signal into a corresponding pulse-width modulation signal;
   a power amplifier for amplifying the pulse-width modulation signal;
   a low pass filter for removing carrier components from an output signal of the power amplifier and generating a demodulated signal corresponding to the input analog signal; and
   means for controlling an amplitude of the triangular carrier signal in response to a power supply voltage fed to the power amplifier so that the amplitude of the triangular carrier signal will be substantially proportional to the power supply voltage;
   wherein the controlling means comprises:
   means for outputting a voltage V12 which is given as follows:

$$V12 = Vr - Vc/k$$

where

Vr denotes a stabilized dc voltage providing a bias level for the input analog signal; Vc denotes the power supply voltage; and k denotes a predetermined constant;
   means for outputting a voltage V13 which is given as follows:

$$V13 = Vr + Vc/k$$

where

Vr denotes the stabilized dc voltage providing the bias level for the input analog signal; Vc denotes the power supply voltage; and
   k denotes a predetermined constant;
   a capacitor;
   means for selectively charging and discharging the capacitor; and
   means for controlling the charging and discharging means in response to the voltages V12 and V13 to make a minimal level and a maximal level of the triangular carrier signal equal to the voltages V12 and V13 respectively.

7. The pulse-width modulation amplifier of claim 6, wherein the controlling means comprises means for selectively charging and discharging the capacitor at adjustable charging and discharging currents, and means for adjusting the charging and discharging currents in response to the power supply voltage to make the charging and discharging currents substantially proportional to the power supply voltage.

8. The pulse-width modulation amplifier of claim 7, further comprising means connected between the voltage comparator and the power amplifier for reducing a duty cycle of the pulse-width modulation signal at a start and an end of the pulse-width modulation amplifier.

9. The pulse-width modulation amplifier of claim 8, wherein the triangular signal oscillator comprises means for generating a clock signal, and means for generating the triangular carrier signal in response to the clock signal, and wherein the duty cycle reducing means comprises means for reducing the duty cycle in response to the clock signal.

10. The pulse-width modulation amplifier of claim 6, further comprising means connected between the voltage comparator and the power amplifier for reducing a duty cycle of the pulse-width modulation signal at a start and an end of the pulse-width modulation amplifier.

11. The pulse-width modulation amplifier of claim 10, wherein the triangular signal oscillator comprises means for generating a clock signal, and means for generating the triangular carrier signal in response to the clock signal, and wherein the duty cycle reducing means comprises means for reducing the duty cycle in response to the clock signal.

12. A pulse-width modulation amplifier comprising:
a triangular signal oscillator for generating a triangular carrier signal;
a voltage comparator for comparing an input analog signal and the triangular carrier signal and converting the input analog signal into a corresponding pulse-width modulation signal;
a power amplifier for amplifying the pulse-width modulation signal;
a low pass filter for removing carrier components from an output signal of the power amplifier and generating a demodulated signal corresponding to the input analog signal; and
means for controlling an amplitude of the triangular carrier signal in response to a power supply voltage fed to the power amplifier so that the amplitude of the triangular carrier signal will be substantially proportional to the power supply voltage;
wherein the controlling means comprises:
means for outputting a voltage V12 which is given as follows:

$$V12 = Vr - Vc/k$$

where

Vr denotes a bias level of the input analog signal; Vc denotes the power supply voltage; and k denotes a predetermined coefficient;
means for outputting a voltage V13 which is given as follows:

$$V13 = Vr + Vc/k$$

where
Vr denotes the bias level of the input analog signal; Vc denotes the power supply voltage; and k denotes the predetermined coefficient;
a capacitor;
means for selectively charging and discharging the capacitor; and
means for controlling the charging and discharging means in response to the voltages V12 and V13 to make a minimal level and a maximal level of the triangular carrier signal equal to the voltages V12 and V13 respectively.

13. The pulse-width modulation amplifier of claim 12, wherein the controlling means comprises means for selectively charging and discharging the capacitor at adjustable charging and discharging currents, and means for adjusting the charging and discharging currents in response to the power supply voltage to make the charging and discharging currents substantially proportional to the power supply voltage.

14. The pulse-width modulation amplifier of claim 13, further comprising means connected between the voltage comparator and the power amplifier for reducing a duty cycle of the pulse-width modulation signal at a start and an end of the pulse-width modulation amplifier.

15. The pulse-width modulation amplifier of claim 14, wherein the triangular signal oscillator comprises means for generating a clock signal, and means for generating the triangular carrier signal in response to the clock signal, and wherein the duty cycle reducing means comprises means for reducing the duty cycle in response to the clock signal.

16. The pulse-width modulation amplifier of claim 12, further comprising means connected between the voltage comparator and the power amplifier for reducing a duty cycle of the pulse-width modulation signal at a start and an end of the pulse-width modulation amplifier.

17. The pulse-width modulation amplifier of claim 16, wherein the triangular signal oscillator comprises means for generating a clock signal, and means for generating the triangular carrier signal in response to the clock signal, and wherein the duty cycle reducing means comprises means for reducing the duty cycle in response to the clock signal.

* * * * *